United States Patent
Gogoi

(10) Patent No.: US 7,273,762 B2
(45) Date of Patent: Sep. 25, 2007

(54) MICROELECTROMECHANICAL (MEM) DEVICE INCLUDING A SPRING RELEASE BRIDGE AND METHOD OF MAKING THE SAME

(75) Inventor: Bishnu Prasanna Gogoi, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 210 days.

(21) Appl. No.: 10/985,530

(22) Filed: Nov. 9, 2004

(65) Prior Publication Data

US 2006/0096377 A1    May 11, 2006

(51) Int. Cl.
*H01L 21/00* (2006.01)

(52) U.S. Cl. .................................... 438/50
(58) Field of Classification Search ............. 438/50, 438/52
See application file for complete search history.

(56) References Cited

U.S. PATENT DOCUMENTS

| | | | |
|---|---|---|---|
| 5,258,097 A | 11/1993 | Mastrangelo | |
| 5,542,295 A | 8/1996 | Howe et al. | |
| 5,721,377 A * | 2/1998 | Kurle et al. | 73/504.12 |
| 6,232,104 B1 | 5/2001 | Ferrari et al. | |
| 6,538,296 B1 * | 3/2003 | Wan | 257/415 |
| 6,544,898 B2 | 4/2003 | Polson et al. | |
| 6,770,506 B2 | 8/2004 | Gogoi | |
| 7,102,467 B2 * | 9/2006 | Lutz et al. | 333/186 |
| 2003/0032215 A1 * | 2/2003 | Ives | 438/52 |
| 2004/0053434 A1 * | 3/2004 | Bruner | 438/52 |

OTHER PUBLICATIONS

Sulfridge et al., "Optical Actuation of a Bistable MEMS", IEEE, Journal of Microelectromechanical Systems, vol. 11, No. 5, Oct. 2003, pp. 574-583.*

* cited by examiner

*Primary Examiner*—W. David Coleman
(74) *Attorney, Agent, or Firm*—Ingrassia Fisher & Lorenz

(57) ABSTRACT

A microelectromechanical (MEM) device includes a substrate, a suspension spring, a structure, and a release bridge. The suspension spring is coupled to, and suspended above, the substrate. The structure is coupled to the suspension spring and is resiliently suspended thereby above the substrate. The release bridge is coupled to the suspension spring. During sensor manufacture, the suspension spring and structure are suspended above the substrate by undergoing a release process. The release bridge is sized such that, during the release process, the structure and the suspension spring are released substantially simultaneously.

32 Claims, 3 Drawing Sheets

MICROELECTROMECHANICAL (MEM) DEVICE INCLUDING A SPRING RELEASE BRIDGE AND METHOD OF MAKING THE SAME

TECHNICAL FIELD

The present invention generally relates to microelectromechanical (MEM) devices and, more particularly, to a MEM device that includes a release bridge on the suspension springs that allows the suspension springs and the seismic mass to be released substantially simultaneously during the manufacturing process.

BACKGROUND

Many devices and systems include various numbers and types of sensors. The varied number and types of sensors are used to perform various monitoring and/or control functions. Advancements in micromachining and other microfabrication techniques and associated processes have enabled manufacture of a wide variety of microelectromechanical (MEM) devices, including various types of sensors. Thus, in recent years, many of the sensors that are used to perform monitoring and/or control functions are implemented using MEM sensors.

One current method that is used to form a MEM device makes use of a modified wafer known as a silicon-on-insulator (SOI) wafer. As is generally known, an SOI wafer is essentially a silicon wafer having a sacrificial layer disposed thereon, and an active, single-crystalline silicon, layer disposed on the sacrificial layer. The active layer is masked, patterned, and selectively etched to define the basic structural features of the MEM device. This structure may then be further processed to define various features, such as metal interconnects or isolation structures. After the all structural features are defined, portions of the structure may then be undercut by removing portions of the sacrificial layer below the structure, thereby releasing those structure portions.

The above-noted release process may be implemented as either a single-step etch process or a two-step etch process. With a single-step etch process, the device undergoes a single etch process until full structure release occurs. If a two-step process is used, during the first step, the device undergoes a first etch process that results in only a partial structure release. During the second step, the device undergoes a second etch process that results in a full structure release.

One particular type of MEM sensor that is used in various applications is an accelerometer. Typically, a MEM accelerometer includes, among other component parts, a seismic mass that is resiliently suspended by one or more suspension springs. The seismic mass and suspension spring may each include one or more etch openings that allow an etchant to reach, and thereby remove, the sacrificial layer during the release process. Preferably, the seismic mass includes a plurality of etch openings that are sized and spaced to facilitate the undercut of the seismic mass, whether a single-step or a two-step release process is used.

In high sensitivity (e.g., high aspect ratio) accelerometers, the suspension springs are relatively long and thin, and the seismic mass is relatively large. One method that may be used to increase the seismic mass is to reduce the number, and increase the spacing between, the etch openings that are formed therein. Thus, in many instances, whether a single-step or a two-step release process is used, the suspension spring may be released before the seismic mass is released. When this occurs, the suspension springs can be susceptible to stiction, which can render the MEM accelerometer inoperable.

Hence, there is a need for a MEM device, such as a high aspect ratio accelerometer, and a method of making the same, that reduces the susceptibility thereof to stiction. The present invention addresses at least this need. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In this regard, although the invention is depicted and described in the context of an accelerometer, it will be appreciated that the invention could be used for any one of numerous devices that include a structure and one or more suspension springs.

Figure 1:
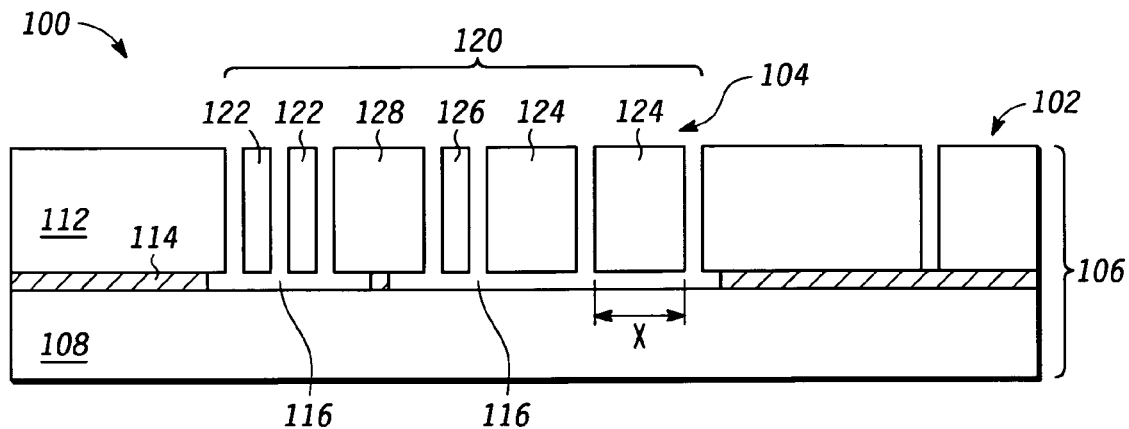
FIG. 1 is a simplified cross section view of an exemplary microelectromechanical (MEM) sensor in accordance with an embodiment of the present invention.

Turning now to the description, and with reference first to FIG. 1, an exemplary microelectromechanical (MEM) device 100 is depicted. The depicted MEM device 100, which is shown in simplified cross section form, is an inertial sensor, such as an accelerometer, and includes an anchor region 102 and a sensor region 104 formed on an SOI (silicon-on-insulator) wafer 106. The SOI wafer 106, as is generally known, includes a handle layer 108, an active layer 112, and a sacrificial layer 114 disposed between the handle layer 108 and the active layer 112. The anchor region 102 and sensor region 104 are both formed in the active layer 112. The anchor region 102 is a region of the active layer 112 that remains affixed to the handle layer 108, via the sacrificial layer 114. Conversely, the sensor region 104, while being coupled to the anchor region 102, is also partially released from the handle layer 108. As will be described more fully below, during a release process, the sensor region 104 is partially undercut by removing portions the sacrificial layer 114 below the sensor region 104. This undercut forms a release trench 116, and releases portions of the sensor region 104 from the handle layer 108. The released portions of the sensor region 104 are thus suspended above the wafer 106.

The sensor region 104 includes a plurality of sensor elements 120, which may vary depending, for example, on the particular MEM sensor 100 being implemented. However, in the depicted embodiment, in which the MEM sensor 100 is an accelerometer, the sensor elements 120 include a suspension spring 122, a structure 124, which in this case is a seismic mass, a moving electrode 126, and a fixed electrode 128. As is generally known, the suspension spring 122 resiliently suspends the seismic mass 124 and the moving electrode 126 above the handle layer 108. As was mentioned above, and will be described more fully below, during a release process, when the release trench 116 is formed in the wafer 106, the suspension spring 122, the seismic mass 124, and the moving electrode 126 are all released from the wafer 106, but the fixed electrode 128 remains affixed to the wafer 106. Thus, the suspension spring 122, seismic mass 124, and moving electrode 126 are suspended above the wafer.

For clarity and ease of illustration, it will be appreciated that the sensor region 104 is depicted in FIG. 1 to include only a single suspension spring 122, a single moving electrode 126, and a single fixed electrode 128. However, in a particular physical implementation, which is shown more clearly in FIG. 2, and which will now be described in more detail, the sensor region 104 includes a pair of suspension springs 122, a plurality of moving electrodes 126, and a plurality of fixed electrodes 128. The suspension springs 122 are each coupled between the anchor region 102 and the seismic mass 124 and, as was previously noted, resiliently suspend the seismic mass 124, when released, above the wafer 106. The moving electrodes 126 are each coupled to the seismic mass 124, and thus are also, when released, suspended above wafer 106. As FIG. 2 also shows, the moving electrodes 126 are each disposed between two fixed electrodes 128. The fixed electrodes 128, as was noted above, are not released. Rather, the fixed electrodes 128 remain anchored to the wafer 104, via a plurality of anchors 202.

Figure 2:
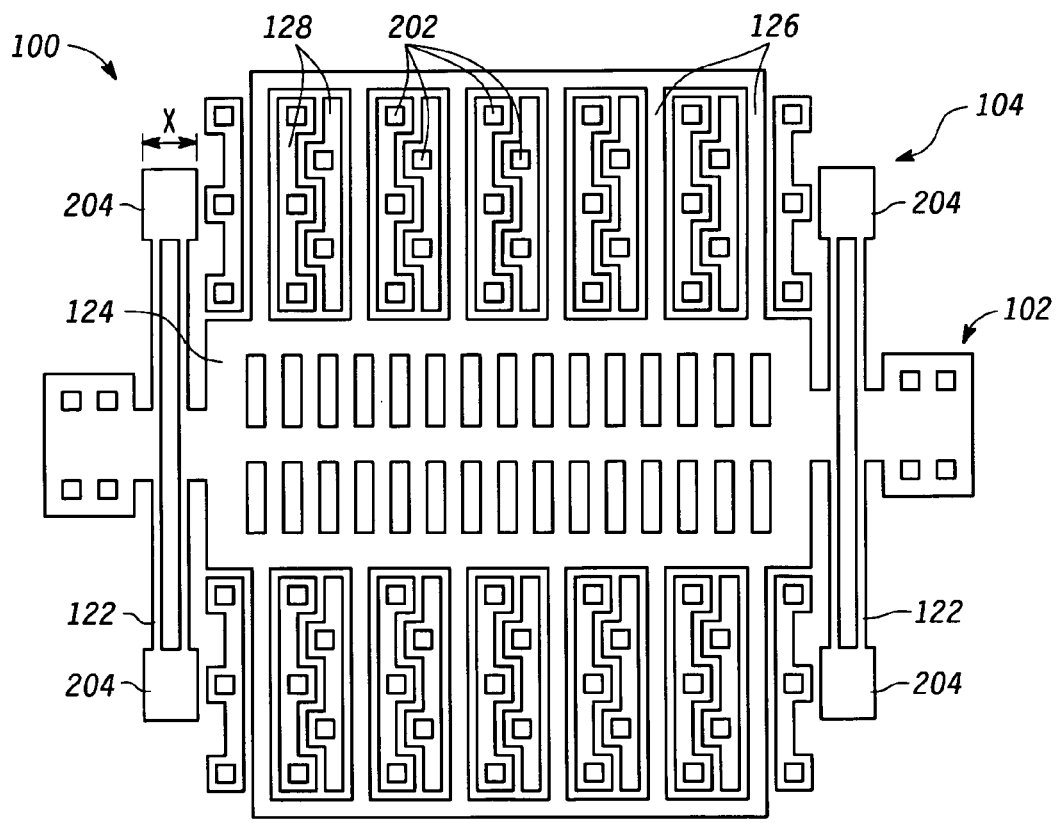
FIG. 2 is a top view of an actual physical implementation of the exemplary MEM sensor shown in FIG. 1.

As FIG. 2 also shows, a release structure 204 (or release bridge) is formed on each of the suspension springs 122. In the depicted embodiment, a release bridge 204 is formed on first and second ends 206, 208 of the suspension springs 122, for a total of four release bridges 204. It will be appreciated, however, that this is merely exemplary of a preferred embodiment, and that more or less than this number of releases bridges 204 could be provided, and that one or more of the release bridges 204 could be formed on one or more other portions of the suspension springs 122. It will additionally be appreciated that the shape of the release bridge 204 is not limited to that shown in FIG. 2, but instead could be any one of numerous shapes. No matter its specific shape, number, or specific location on the suspension springs 122, each release bridge 204 is preferably sized such that when the seismic mass 124 is released, the suspension springs 122 are released substantially simultaneously. To do so, the size of each release bridge 204 is preferably comparable to the largest undercut needed for the final release of the seismic mass 124. For example, and with reference to FIGS. 1 and 2, if the largest undercut needed for the final release of the seismic mass 124 "x," then the width of each release bridge 204 is also preferably "x," or even more preferably just slightly greater than "x." A preferred method of implementing the release of the sensor region 104 will be described in more detail further below.

As is generally known, an accelerometer 100,200 constructed as shown in FIGS. 1 and 2, is typically implemented as a capacitance type accelerometer. That is, when the accelerometer 100,200 experiences an acceleration, the seismic mass 124 will move, due to the flexibility of the suspension springs 122, a distance that is proportional to the magnitude of the acceleration being experienced. The moving electrodes 126 are connected to the seismic mass 124, and will thus move the same distance as the seismic mass 124. The moving electrodes 126 and the fixed electrodes 128 adjacent each moving electrode 126 together form a variable differential capacitor. Thus, when the accelerometer 100, 200 experiences an acceleration, each moving electrode 126 will move toward one of the adjacent fixed electrodes 128 and away from another of the adjacent fixed electrodes 128. The distance that the moving electrodes 126 move will result in a proportional change in capacitance between the fixed electrodes 126 and the moving electrodes 128. This change in capacitance may be measured and used to determine the magnitude of the acceleration.

Having described a MEM accelerometer 100,200 from a structural standpoint. A particular preferred process of forming the described MEM accelerometer 100,200 will now be described. In doing so reference should be made, as appropriate, to FIGS. 3-7. It will be appreciated that, for clarity and ease of explanation, the process will be depicted and described using a simplified cross section view, similar to that shown in FIG. 1. However, it will be further appreciated that the process is applicable to the actual physical MEM accelerometer 200 illustrated in FIG. 2 and described above, as well as any one of numerous other MEM sensors that may be implemented.

Figure 3:
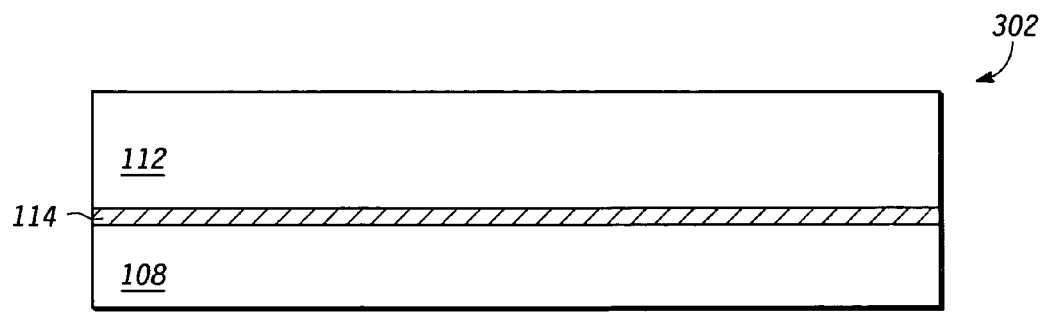
FIGS. 3-7 are simplified cross section views of the MEM sensor shown in FIG. 1, illustrating the various exemplary methodological steps that are used to make the MEM sensor in accordance with an embodiment of the present invention.

With the above background in mind, and with reference first to FIG. 3, it is seen that the preferred starting material 302 for the process is an SOI wafer 106. Alternatively, the starting material 302 may be any one of numerous other articles that include a handle layer 108, an active layer 112, and an interposed sacrificial layer 114. No matter the specific type of starting material, the handle layer 108 and active layer 112 are each preferably made of silicon, though it will be appreciated that these layers could be made of other materials. It will be appreciated that the active layer 112 may be, for example, epitaxial silicon, or any other material from which the MEM sensor elements 120 may be formed. The sacrificial layer 114 is preferably made of a material, such as silicon oxide, doped oxide, and doped silicate glass, just to name a few, that can be readily etched to release at least some of the sensor elements 120 from the handle layer 108. It will be appreciated that the starting material 302 may include the handle layer 108, the active layer 112, and sacrificial layer 114 when obtained, or one or more of these layers may be formed as part of the overall process.

Figure 4:
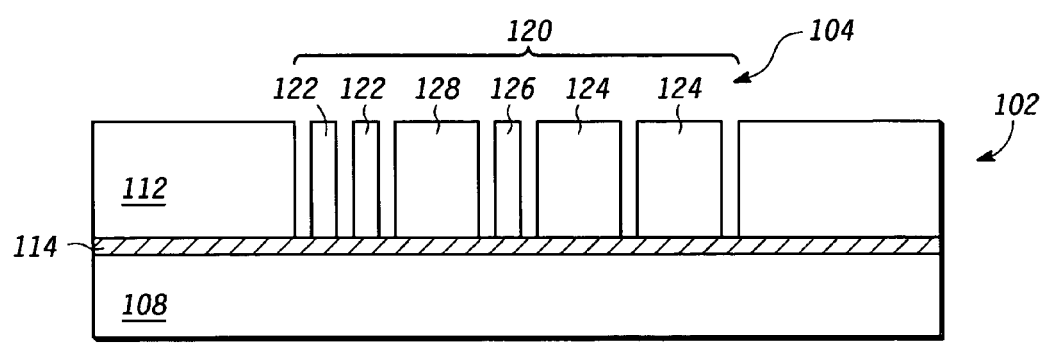
Figure 5:
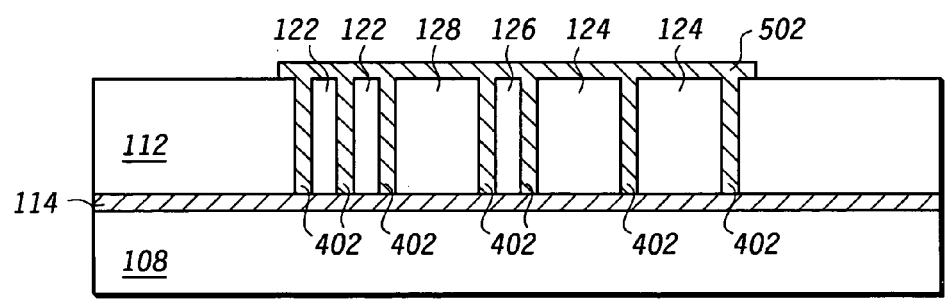

Having obtained (or prepared) the starting material 302, and as shown in FIG. 4, the active layer 112 is then patterned and etched to define the anchor region 102 and the sensor region 104 therein. It will be appreciated that any one of numerous patterning and etching processes may be used; however, in a preferred embodiment, a dry reactive ion etch (DRIE) process is used. No matter the specific process that is used, it results in a plurality of etch openings 402 being formed in the sensor region 104, which define the structural features of the individual sensor elements 120. As FIG. 4 furthers shows, etch openings 402 are also formed in selected ones of the sensor elements 120, such as the suspension spring 122 and the seismic mass 124. No matter the specific location, the etch holes 402 each provide access to the sacrificial layer 114, whereby the release of a portion of the sensor region 104 is effected. The size and number of etch openings 402, both in and between the sensor elements 120, are at least partially selected to implement the desired sequence and/or timing of the release of the sensor elements 120. Moreover, the number and spacing of the etch openings 402 in the seismic mass 124 are selected to achieve, among other things, desired response characteristics.

Those portions of the sensor region 104 that are released may be undercut using either a single-step release process or a two-step process. If a single-step release process is used, it may be implemented using any one of numerous etch processes including, for example, a wet etch process or a vapor phase etch process. In the preferred embodiment, a two-step release process is used, and will now be described in more detail. Before proceeding to this description, however, it is noted that if the single-step release process is used, the release bridge 204 is sized and/or configured such that the suspension spring 122 and seismic mass 124 are released substantially simultaneously.

Figure 6:
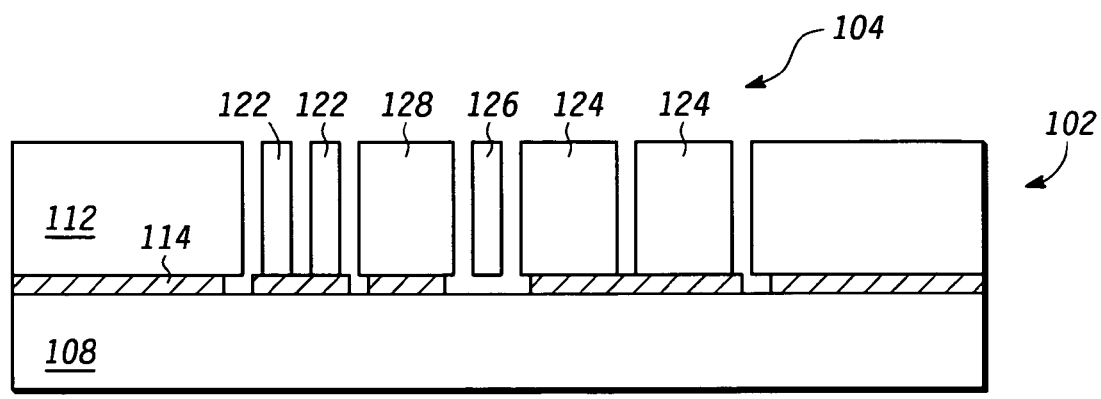

The first step of the two-step release process is an incomplete release etch process. That is, as shown in FIG. 6, only a portion of the sacrificial layer 114 is removed, thereby fully releasing only some of the sensor elements 120, and only partially releasing various other sensor elements 120. For example, in the depicted embodiment, at most only portions of the suspension spring 122 and seismic mass 126 are undercut, and are thus not released. However, the moving electrode 126 is fully undercut, and is thus fully released. It will be appreciated that a majority portion of the suspension spring 122 may be released during the first release process; however, the release bridge 204 (not shown) is sized such that it is not released during the first release process. Thus, both the suspension spring 122 and the seismic mass 124 remain fixed upon completion of the first release process.

Although various etch processes could be used to effect the first release process, in a preferred embodiment, a wet etch process is used. Preferably, a wet etch solution, such as an aqueous hydrofluoric acid (HF) solution, is used to implement the wet etch process. Moreover, as is shown more clearly in FIG. 5, in the preferred embodiment, before the wet etch solution is supplied, a backfill material 502 is deposited in each of the etch openings 402. The backfill material 502 is may be any one of numerous types of readily etchable materials such as, for example, $SiO_2$, $Si_3N_4$, borosilicate glass (BSG), borophosphosilicate glass (BPSG), tetraethoxysilicate (TEOS), and undoped silicon glass (USG). Moreover, it will be appreciated that in some embodiments the backfill material 502 may be the same as the material of the sacrificial layer 114. However, in the preferred embodiment, the backfill material is phosphosilicate glass (PSG). Nonetheless, it will be further appreciated that the exact choice of backfill material 502 for a given application may depend, for example, on such factors as the composition of the various sensor components 102 and other structural features that will be present on the accelerometer 100, 200 at the time that the first step is carried out, the specific etchant that is used, and the selectivity of the etchant to the materials of these features or components 102.

Figure 7:
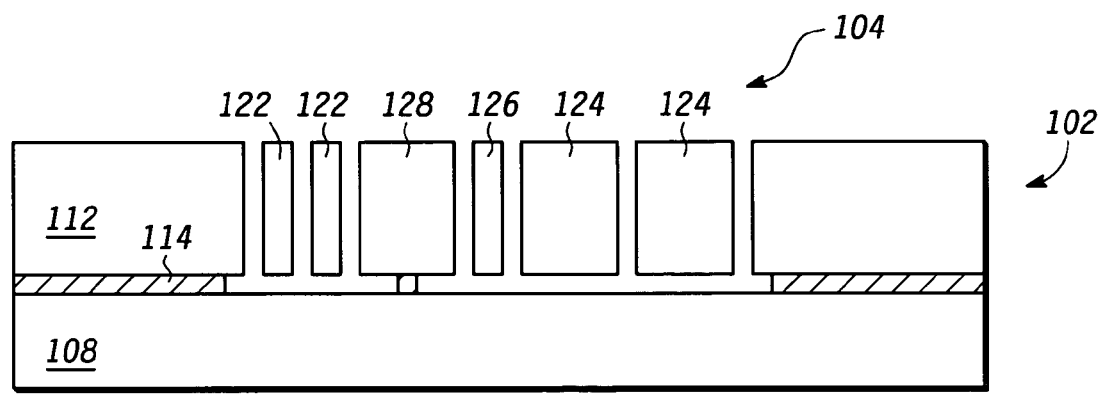

The second step of the release process, the result of which is shown in FIG. 7, results in the complete release of the remaining portion of the sensor elements 120 that are desired to be released. Thus, in the depicted embodiment, the remaining portion of the sacrificial layer 114 under the suspension spring 122 (if any), the seismic mass 124, and the release bridge 204 (not shown in FIG. 7) is removed, thereby fully undercutting and releasing the suspension spring 122 and the seismic mass 124. As with the first release process, various release etch processes could be used to implement the second release process. In a preferred embodiment, however, a vapor phase etch process is used. Preferably, a vapor phase etch solution, such as vapor phase HF, is used to implement the vapor phase etch process. It will be appreciated that other release and dry techniques can also be used such as, for example, supercritical $CO_2$ drying, to prevent stiction.

The preferred two-step release process described above, in combination with the release bridge 204, results in at least portions of the suspension spring 122, and the seismic mass 124, remaining affixed to the wafer 106 following the first step, and the suspension spring 122 and seismic mass 124 being released substantially simultaneously during the second step. In addition, because the second step of the release process is preferably implemented using a vapor phase etch process, the potential stiction generating forces associated with a wet etch process, such as Van der Waals and capillary forces, are eliminated. Furthermore, because the first step of the release process is preferably implemented using a wet etch process, the first step of the release may be performed in a wet hood, which is a batch process. This can relieve certain throughput issues associated with a vapor phase etch, which is preferably used to implement the second step of the release process, and which exhibits a lower etch rate.

As was previously noted, although the above-described MEM devices 100, 200 are accelerometers, the manufacturing process described herein is not limited to accelerometers or any other type of sensor. But is applicable to any one of numerous MEM devices that include some type of structure that is resiliently suspended by one or more springs. Non-limiting examples of such devices include various types of gyroscopes and switches.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a microelectromechanical (MEM) device on a substrate including at least an active layer, and a sacrificial layer disposed at least partially therebetween, the method comprising the steps of:

forming at least an anchor region and a suspension region in the active layer, the suspension region having formed therein at least a mass structure, a suspension spring, and a release bridge, the suspension spring coupled between the anchor region and the mass structure, the release bridge coupled to the suspension spring and to the mass structure; and removing at least a portion of the sacrificial layer to thereby release the mass structure, the release bridge, and the suspension spring from the substrate, wherein the release bridge is sized such that the mass structure and the suspension spring are released substantially simultaneously during sacrificial layer removal.

2. The method of claim 1, further comprising:

forming a plurality of etch openings in the active layer; and exposing the sacrificial layer to a first etchant via the etch openings, whereby at least a portion of the sacrificial layer is removed.

3. The method of claim 1, wherein:
the suspension spring has at least first and second ends; and
the release bridge is formed at least proximate the suspension spring first end, and a second release bridge is formed at least proximate the suspension spring second end.

4. The method of claim 1, wherein the suspension region further includes:
a second suspension spring coupled between the anchor region and the mass structure; and
a second release bridge coupled between the anchor region and the second suspension spring.

5. The method of claim 1, wherein:
the mass structure, release bridge, and suspension spring are released by undercutting the sacrificial layer; and
the release bridge is sized substantially equivalent to a largest undercut needed to release at least the mass structure.

6. The method of claim 1, wherein the mass structure is a seismic mass.

7. The method of claim 2, wherein at least the mass structure and release bridge are not released when the sacrificial layer is exposed to the first etchant, whereby the suspension spring is also not released.

8. The method of claim 2, further comprising:
depositing a backfill material in at least selected ones of the etch openings;
exposing at least the deposited backfill material to a first etchant to thereby remove at least a substantial portion of the backfill material; and
exposing the sacrificial layer to a second etchant, whereby at least a portion of the sacrificial layer is removed to thereby release the mass structure, the release bridge, and the suspension spring.

9. The method of claim 4, wherein:
each suspension spring has at least a first end and a second end; and
a release bridge is formed at least proximate each of the first and second ends of each suspension spring.

10. The method of claim 7, further comprising:
exposing the sacrificial layer to a second etchant to thereby release the mass structure and release bridge substantially simultaneously, whereby the suspension spring and mass structure are released substantially simultaneously.

11. The method of claim 8, wherein the backfill material comprises phosphosilicate glass.

12. The method of claim 8, wherein:
the first etchant is an aqueous etchant; and
the second etchant is a vapor etchant.

13. The method of claim 12, wherein the aqueous etchant comprises aqueous hydrofluoric acid (HF).

14. The method of claim 12, wherein the vapor etchant comprises HF vapor.

15. A method for forming an inertial sensor on a substrate, comprising the steps of: forming a sacrificial layer on a surface of the substrate;
forming an active layer over at least a portion of the sacrificial layer;
forming at least an anchor region and a suspension region in the active layer, the suspension region having formed therein at least a mass structure, a suspension spring, and a release bridge, the suspension spring coupled between the anchor region and the mass structure, and the release bridge coupled to the suspension spring and to the mass structure; and
removing at least a portion of the sacrificial layer to thereby release the mass structure, the release bridge, and the suspension spring from the substrate,
wherein the release bridge is sized such that the mass structure and the suspension spring are released substantially simultaneously during sacrificial layer removal.

16. The method of claim 15, further comprising:
forming a plurality of etch openings in the active layer; and
exposing the sacrificial layer to a first etchant via the etch openings, whereby at least a portion of the sacrificial layer is removed.

17. The method of claim 15, wherein:
the suspension spring has at least first and second ends; and
the release bridge is formed at least proximate the suspension spring first end, and a second release bridge is formed at least proximate the suspension spring second end.

18. The method of claim 15, wherein the suspension region further includes:
a second suspension spring coupled between the anchor region and the mass structure; and
a second release bridge coupled between the anchor region and the second suspension spring.

19. The method of claim 15, wherein:
the mass structure, release bridge, and suspension spring are released by undercutting the sacrificial layer; and
the release bridge is sized substantially equivalent to a largest undercut needed to release at least the mass structure.

20. The method of claim 15, wherein the mass structure is a seismic mass.

21. The method of claim 16, wherein at least the mass structure and release bridge are not released when the sacrificial layer is exposed to the first etchant, whereby the suspension spring is also not released.

22. The method of claim 16, further comprising:
depositing a backfill material in at least selected ones of the etch openings;
exposing at least the deposited backfill material to a first etchant to thereby remove at least a substantial portion of the backfill material; and
exposing the sacrificial layer to a second etchant, whereby at least a portion of the sacrificial layer is removed to thereby release the mass structure, the release bridge, and the suspension spring.

23. The method of claim 18, wherein:
each suspension spring has at least a first end and a second end; and
a release bridge is formed at least proximate each of the first and second ends of each suspension spring.

24. The method of claim 21, further comprising:
exposing the sacrificial layer to a second etchant to thereby release the mass structure and release bridge substantially simultaneously, whereby the suspension spring and mass structure are released substantially simultaneously.

25. The method of claim 22, wherein the backfill material comprises phosphosilicate glass.

26. The method of claim 22, wherein:
the first etchant is an aqueous etchant; and
the second etchant is a vapor etchant.

27. The method of claim 26, wherein the aqueous etchant comprises aqueous hydrofluoric acid (HF).

28. The method of claim 26, wherein the vapor etchant comprises HF vapor.

29. A method for forming a microelectromechanical (MEM) device on a substrate including at least an active layer, and a sacrificial layer disposed at least partially therebetween, the method comprising the steps of:

forming at least an anchor region and a suspension region in the active layer, the suspension region having formed therein at least a structure, a suspension spring, and a release bridge, the suspension spring coupled between the anchor region and the structure, the release bridge coupled to the suspension spring;

removing at least a portion of the sacrificial layer to thereby release the structure, the release bridge, and the suspension spring from the substrate:

forming a plurality of etch openings in the active layer;

exposing the sacrificial layer to a first etchant via the etch openings, whereby at least a portion of the sacrificial layer is removed;

depositing a backfill material in at least selected ones of the etch openings;

exposing at least the deposited backfill material to a first etchant to thereby remove at least a substantial portion of the backfill material; and exposing the sacrificial layer to a second etchant, whereby at least a portion of the sacrificial layer is removed to thereby release the structure, the release bridge, and the suspension spring, wherein the backfill material comprises phosphosilicate glass, and wherein the release bridge is sized such that the structure and the suspension spring are released substantially simultaneously during sacrificial layer removal.

30. The method of claim 29, wherein:

the first etchant is an aqueous etchant; and the second etchant is a vapor etchant.

31. The method of claim 30, wherein the aqueous etchant comprises aqueous hydrofluoric acid (HF).

32. The method of claim 30, wherein the vapor etchant comprises HF vapor.

* * * * *